(12) United States Patent
Tokai

(10) Patent No.: US 9,680,466 B2
(45) Date of Patent: Jun. 13, 2017

(54) ANALOG SWITCH AND MULTIPLEXER

(71) Applicant: Kabushiki Kaisha Toshiba, Minato-Ku, Tokyo (JP)

(72) Inventor: Yoichi Tokai, Shinagawa Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 86 days.

(21) Appl. No.: 14/848,074

(22) Filed: Sep. 8, 2015

(65) Prior Publication Data

US 2016/0204780 A1 Jul. 14, 2016

(30) Foreign Application Priority Data

Jan. 8, 2015 (JP) .................... 2015-002585

(51) Int. Cl.
*H03K 17/687* (2006.01)
*H03K 17/693* (2006.01)
*H03K 17/06* (2006.01)
*H03K 17/16* (2006.01)
*H03K 17/00* (2006.01)

(52) U.S. Cl.
CPC ....... *H03K 17/6871* (2013.01); *H03K 17/063* (2013.01); *H03K 17/165* (2013.01); *H03K 17/693* (2013.01); *H03K 17/005* (2013.01); *H03K 17/687* (2013.01); *H03K 2217/0054* (2013.01)

(58) Field of Classification Search
None
See application file for complete search history.

(56) References Cited

U.S. PATENT DOCUMENTS

| | | | | |
|---|---|---|---|---|
| 4,595,847 | A * | 6/1986 | Weir | H03K 17/6874 327/382 |
| 4,672,246 | A * | 6/1987 | Donovan | H03K 17/687 327/436 |
| 4,808,859 | A * | 2/1989 | Even-or | H03K 17/6874 327/382 |
| 5,065,057 | A | 11/1991 | Kawasaki | |
| 6,154,085 | A | 11/2000 | Ramakrishnan | |
| 6,509,781 | B2 | 1/2003 | Dufort | |
| 6,707,405 | B2 | 3/2004 | Kuttner | |

(Continued)

FOREIGN PATENT DOCUMENTS

| | | |
|---|---|---|
| JP | 2642465 B2 | 8/1997 |
| JP | 2000-353944 A | 12/2000 |

*Primary Examiner* — Tuan T Lam
(74) *Attorney, Agent, or Firm* — White & Case LLP

(57) ABSTRACT

The analog switch includes a first DMOS transistor of a second conductivity type that is connected to an input terminal at a first end of a current path thereof and to the gate of the first MOS transistor at a second end of the current path, and is controlled in accordance with the second current. The analog switch includes a second DMOS transistor of the second conductivity type that is connected to the second end of the current path of the first DMOS transistor at a first end of a current path thereof and to an output terminal at a second end of the current path and is controlled in accordance with the second current. The analog switch includes a first switch element that is connected between a gate and the second end of the current path of the first DMOS transistor.

20 Claims, 11 Drawing Sheets

(56) References Cited

U.S. PATENT DOCUMENTS

| | | | |
|---|---|---|---|
| 6,759,888 B1* | 7/2004 | Wodnicki | H03K 17/6874 |
| | | | 323/315 |
| 7,049,877 B2 | 5/2006 | Clara et al. | |
| 7,504,873 B2 | 3/2009 | Bourgoin et al. | |
| 7,521,984 B2* | 4/2009 | Ricotti | H03K 17/04206 |
| | | | 327/318 |
| 8,111,094 B2 | 2/2012 | Fischer | |
| 8,149,042 B2 | 4/2012 | Nakahara et al. | |
| 2006/0043499 A1* | 3/2006 | De Cremoux | H03K 17/6874 |
| | | | 257/401 |
| 2014/0145781 A1* | 5/2014 | Taylor | H03K 17/302 |
| | | | 327/427 |
| 2016/0020760 A1* | 1/2016 | Li | H03K 17/161 |
| | | | 327/382 |
| 2016/0173079 A1* | 6/2016 | Fiedorow | H03K 17/162 |
| | | | 327/408 |
| 2016/0268892 A1* | 9/2016 | Gupta | H02M 3/07 |

* cited by examiner

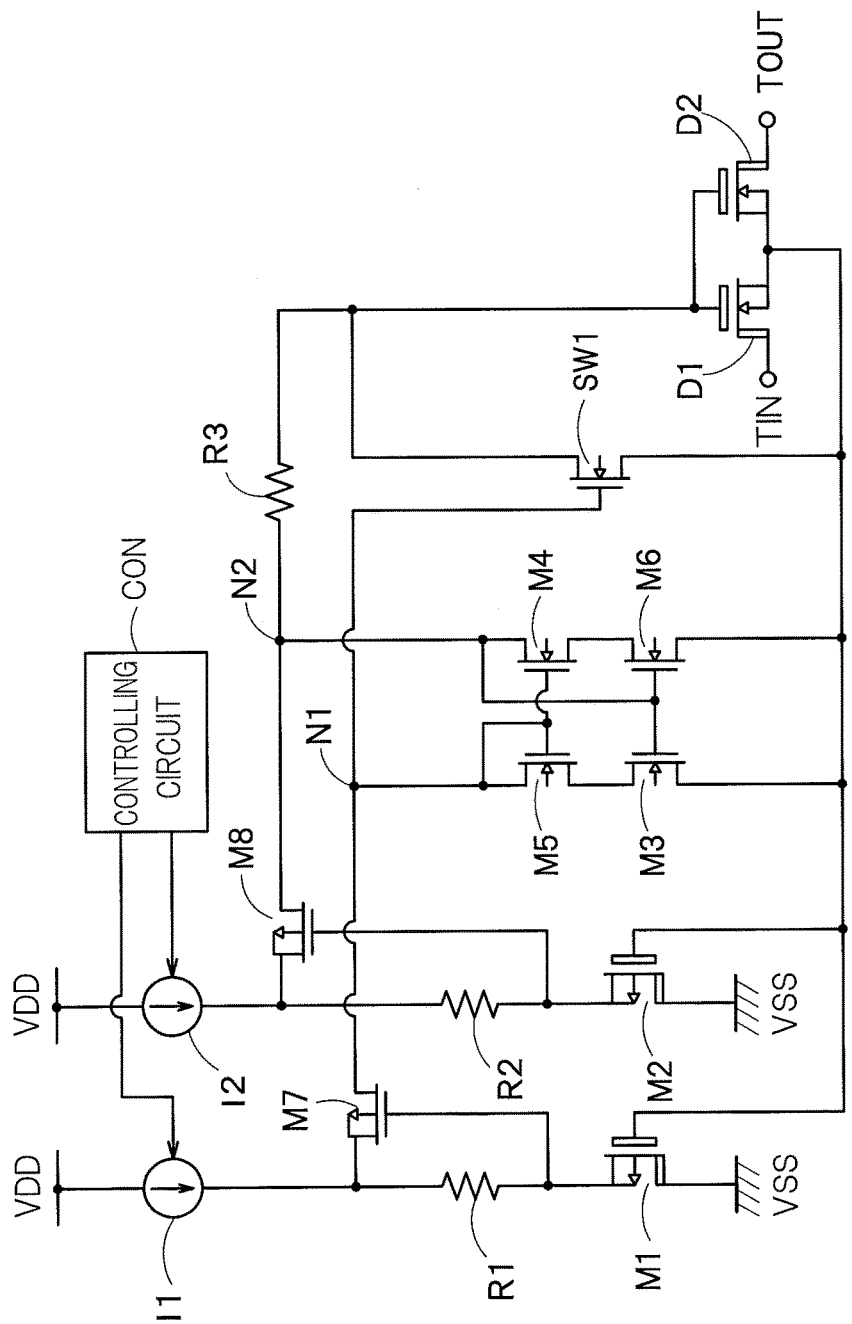
F I G. 1

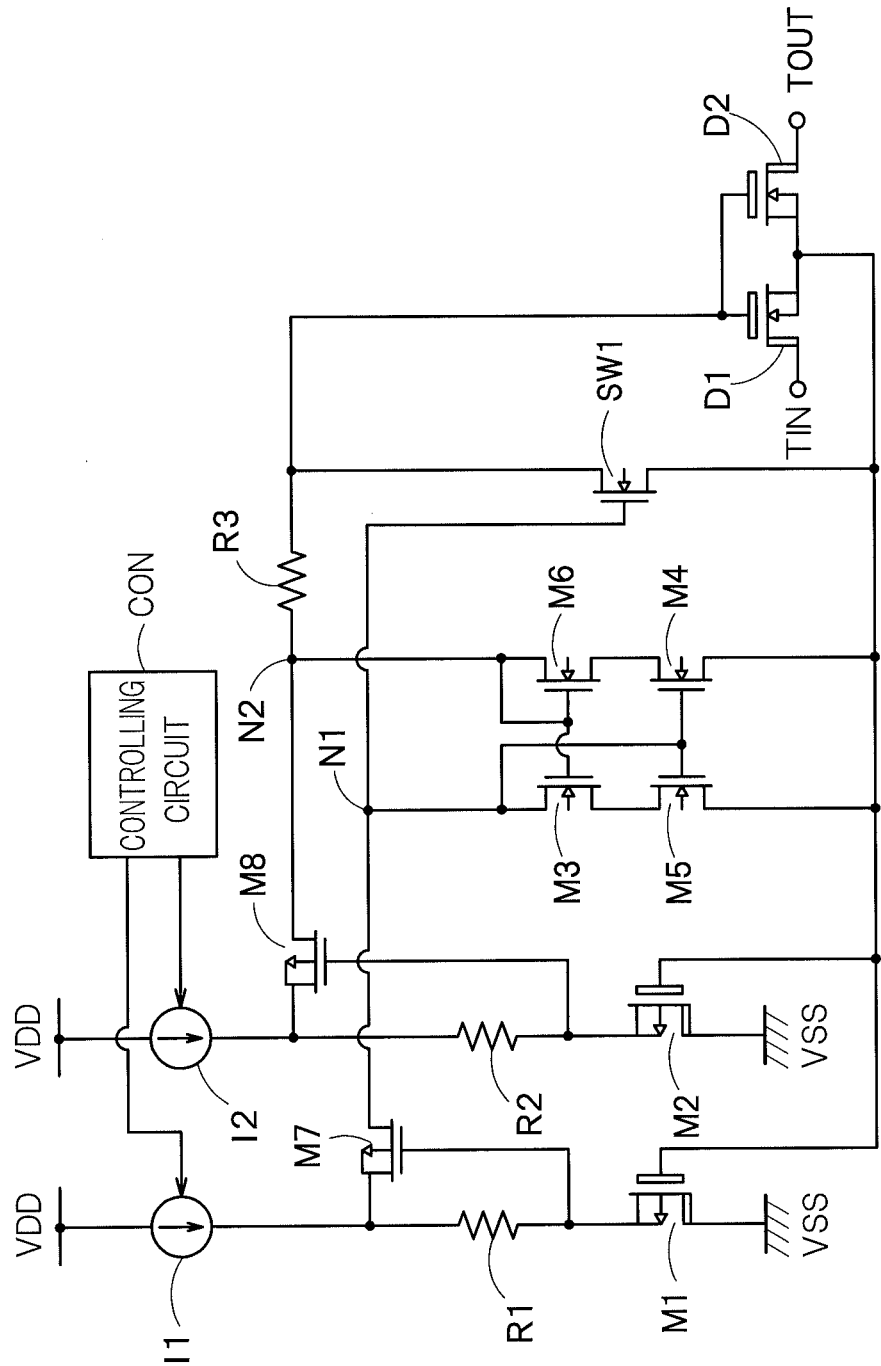
F I G. 4

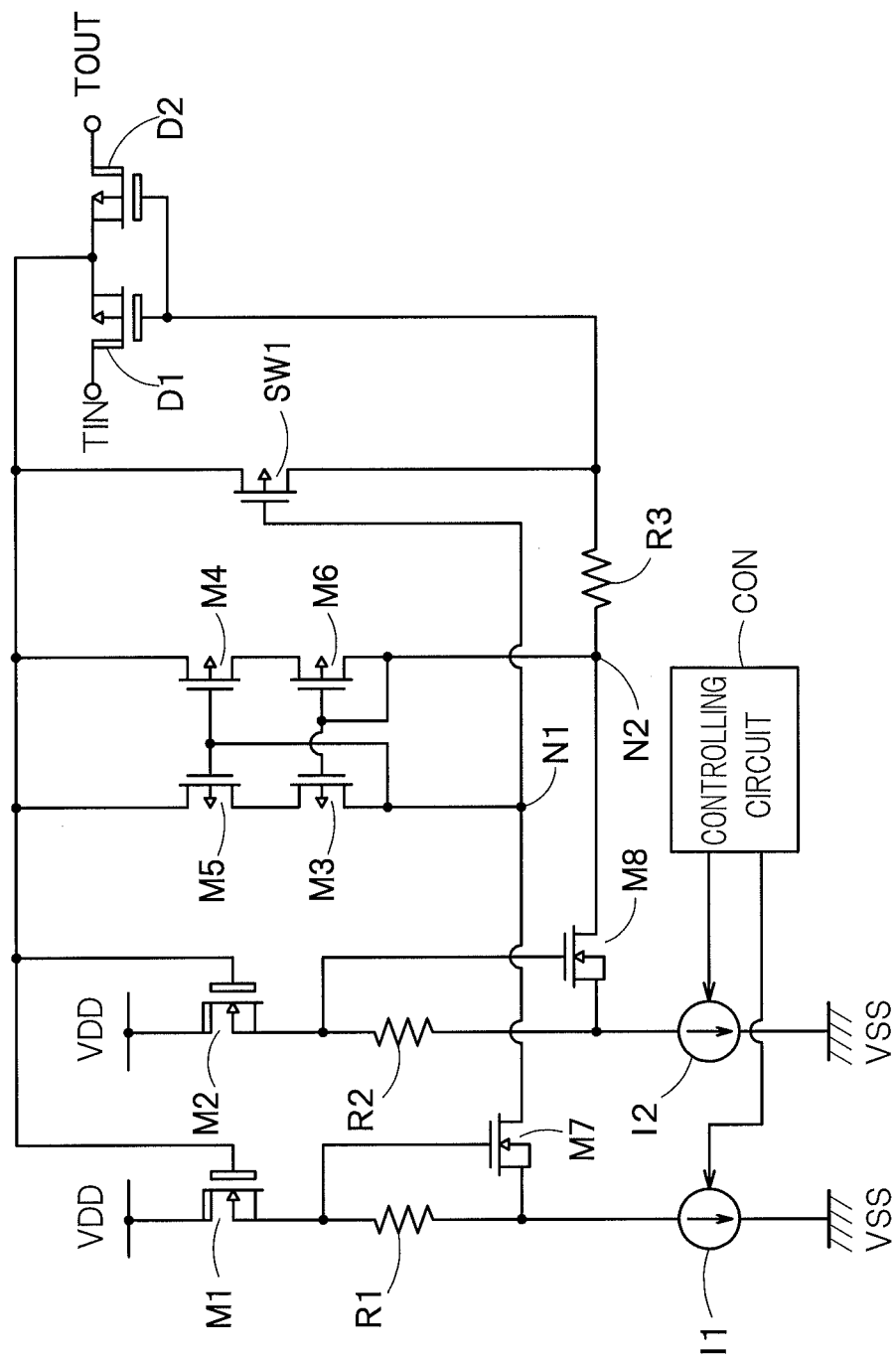
F I G. 6

ANALOG SWITCH AND MULTIPLEXER

CROSS-REFERENCE TO RELATED APPLICATION

This application is based upon and claims the benefit of priority from the prior Japanese Patent Application No. 2015-002585, filed on Jan. 8, 2015, the entire contents of which are incorporated herein by reference.

BACKGROUND

Field

Embodiments described herein relate generally to an analog switch and a multiplexer.

Background Art

Automobiles such as hybrid cars and electric vehicles (EV) that use multiple secondary batteries connected in series or power storage systems need to monitor the amount of electricity remaining in the battery cells and precisely measure the voltage of each battery cell for cell abnormality detection. According to prior art, a multi-channel analog switch that connects an arbitrary cell to an A/D converter is used for such measurement.

There is a high-voltage analog switch that is used in a secondary battery system that has a plurality of cells connected in series with each other and provides electric power at a voltage of several tens volts or higher. The FET of the high-voltage analog switch is required to withstand a voltage of several tens volts or higher at least between the drain and the source.

However, the FET may only be able to withstand a voltage of several to a dozen volts between the gate and the source. In that case, a current is passed to a resistor connected between the gate and the source of the FET to achieve a controlled voltage falling within the withstand voltage range between the gate and the source.

However, part of the current flowing through the resistor flows to the FET to cause a voltage drop, which leads to a voltage difference between the input and the output of the analog switch. For precise measurement, the difference needs to be cancelled.

A method of cancelling the difference involves connecting a current source that derives, from the source side, a current that has a strength equal to the strength of the current passed to the gate side of the resistor.

However, if the voltage of the connected cell is the minimum or maximum voltage, it is difficult to make the currents agree with each other until the difference is completely cancelled.

The voltage drop caused by the current flowing to the FET and the on-resistance of the FET produces a difference between the voltage of the input signal and the voltage of the output signal of the analog switch.

BRIEF DESCRIPTION OF THE DRAWINGS

FIG. 1 is a circuit diagram showing an example of a configuration of an analog switch 100 according to a first embodiment;

FIG. 4 is a circuit diagram showing an example of a configuration of an analog switch 200 according to the second embodiment;

FIG. 6 is a circuit diagram showing an example of a configuration of an analog switch 400 according to the fourth embodiment;

DETAILED DESCRIPTION

Figure 2:
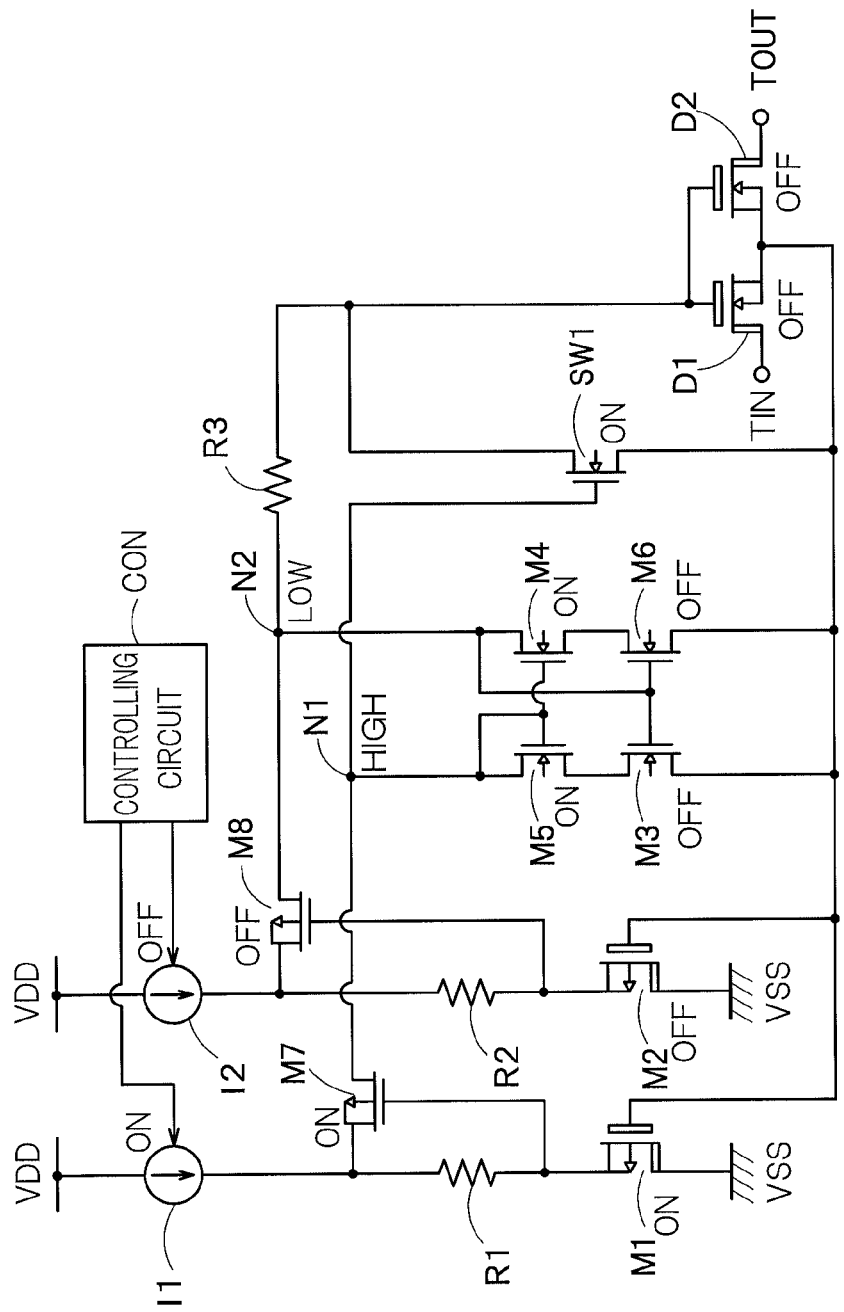
FIG. 2 is a diagram showing a state of the MOS transistors at the time when the analog switch 100 shown in FIG. 1 is in the off state.

An analog switch according to an embodiment includes a first current source that is connected to a first potential at a first end thereof and is driven to pass a first current. The analog switch includes a second current source that is connected to the first potential at a first end thereof and is driven to pass a second current. The analog switch includes a first resistor that is connected to a second end of the first current source at a first end thereof. The analog switch includes a second resistor that is connected to a second end of the second current source at a first end thereof. The analog switch includes a first MOS transistor of a first conductivity type that is connected to a second end of the first resistor at a first end of a current path thereof and to a second potential at a second end of the current path. The analog switch includes a second MOS transistor of the first conductivity type that is connected to a second end of the second resistor at a first end of a current path thereof, to the second potential at a second end of the current path, and to a gate of the first MOS transistor at a gate thereof. The analog switch includes a first DMOS transistor of a second conductivity type that is connected to an input terminal at a first end of a current path thereof and to the gate of the first MOS transistor at a second end of the current path, and is controlled in accordance with the second current. The analog switch includes a second DMOS transistor of the second conductivity type that is connected to the second end of the current path of the first DMOS transistor at a first end of a current path thereof and to an output terminal at a second end of the current path and is controlled in accordance with the second current. The analog switch includes a first switch element that is connected between a gate and the second end of the current path of the first DMOS transistor and is controlled in accordance with the first current.

In the following, embodiments will be described with reference to the drawings.

First Embodiment

FIG. 1 is a circuit diagram showing an example of a configuration of an analog switch 100 according to a first embodiment. In the example shown in FIG. 1, a MOS transistor of a first conductivity type is a pMOS transistor, a MOS transistor of a second conductivity type is an nMOS transistor, a first potential is a power supply potential "VDD", and a second potential is a ground potential "VSS".

As shown in FIG. 1, the analog switch 100 includes a first current source (turning-off current source) "I1", a second current source (turning-on current source) "I2", a first resistor "R1", a second resistor "R2", a third resistor "R3", a first MOS transistor "M1" of the first conductivity type, a second MOS transistor "M2" of the first conductivity type, a third MOS transistor "M3" of the second conductivity type, a fourth MOS transistor "M4" of the second conductivity type, a fifth MOS transistor "M5" of the second conductivity type, a sixth MOS transistor "M6" of the second conductivity type, a seventh MOS transistor "M7" of the first conductivity type, an eighth MOS transistor "M8" of the first conductivity type, a first double-diffused MOS (DMOS) transistor "D1" of the second conductivity type, a second DMOS transistor "D2" of the second conductivity type, a first switch element "SW1", and a controlling circuit "CON".

The first current source "I1" is connected to the first potential at one end thereof and is driven to pass a first current.

The second current source "I2" is connected to the first potential at one end thereof and is driven to pass a second current.

The first resistor "R1" is connected to another end of the first current source "I1" at one end thereof.

The second resistor "R2" is connected to another end of the second current source "I2" at one end thereof.

The first MOS transistor "M1" is connected to another end of the first resistor "R1" at one end (source) of a current path thereof and to the second potential at another end (drain) of the current path.

The first MOS transistor "M1" is a DMOS transistor, for example, as shown in FIG. 1.

The second MOS transistor "M2" is connected to another end of the second resistor "R2" at one end (source) of a current path thereof, to the second potential at another end (drain) of the current path, and to a gate of the first MOS transistor "M1" at a gate thereof.

The second MOS transistor "M2" is a DMOS transistor, for example, as shown in FIG. 1.

Alternatively, the another end of the second resistor "R2" may be connected to the another end of the first resistor "R1" so that the first MOS transistor "M1" doubles as the second MOS transistor "M2". In other words, a single MOS transistor may serve as the first MOS transistor "M1" and the second MOS transistor "M2".

The first DMOS transistor "D1" is connected to an input terminal "TIN" at one end (drain) of a current path thereof and to the another end of the second current source "I2" at a gate thereof via the eighth MOS transistor "M8" and the third resistor.

An input signal is input to the input terminal "TIN".

The second DMOS transistor "D2" is connected to another end (source) of the current path of the first DMOS transistor "D1" at one end (source) of a current path thereof, to an output terminal "TOUT" at another end (drain) of the current path, and to a gate of the first DMOS transistor "D1" at a gate thereof.

The source of the first DMOS transistor "D1" is shared with the second DMOS transistor "D2". Back gates of the first and second DMOS transistors "D1" and "D2" are connected to the sources of the first and second DMOS transistors "D1" and "D2".

In other words, the first DMOS transistor "D1" and the second DMOS transistor "D2" are connected to each other in such a manner that the forward direction of a parasitic diode of the first DMOS transistor "D1" and the forward direction of a parasitic diode of the second DMOS transistor "D2" are opposite to each other.

An output signal is output at an output terminal "TOUT".

For example, when the first and second DMOS transistors "D1" and "D2" are turned on, the input signal input to the input terminal "TIN" is output as the output signal at the output terminal "TOUT".

On the other hand, when the first and second DMOS transistors "D1" and "D2" are turned off, the input signal is interrupted, and no signal is output at the output terminal "TOUT".

The gates of the first and second MOS transistors "M1" and "M2" are connected to the sources of the first and second DMOS transistors "D1" and "D2".

The third MOS transistor "M3" is connected to a first node "N1" at one end (drain) of a current path thereof via the fifth MOS transistor "M5", to the sources of the first and second DMOS transistors "D1" and "D2" at another end (source) of the current path, and to a second node "N2" at a gate thereof.

The first node "N1" is connected to the another end of the first current source "I1." via the seventh MOS transistor "M7". The second node "N2" is connected to the another end of the second current source "I2" via the eighth MOS transistor "M8".

The fourth MOS transistor "M4" is connected to the second node "N2" at one end (drain) of a current path thereof, to the sources of the first and second DMOS transistors "D1" and "D2" at another end (source) of the current path via the sixth MOS transistor "M6", and to the first node "N1" at a gate thereof.

The fifth MOS transistor "M5" is connected to the first node "N1" at one end (drain) thereof, to the one end (drain) of the current path of the third MOS transistor "M3" at another end (source) thereof, and to the gate of the fourth MOS transistor "M4" at a gate thereof.

The sixth MOS transistor "M6" is connected to the another end (source) of the current path of the fourth MOS transistor "M4" at one end (drain) thereof, to the sources of the first and second DMOS transistors "D1" and "D2" at another end (source) thereof, and to the gate of the third MOS transistor "M3" at a gate thereof.

A current path of the seventh MOS transistor "M7" is connected between the one end of the first resistor "R1" and the first node "N1", and the seventh MOS transistor "M7" is connected to the another end of the first resistor "R1" at a gate thereof.

A current path of the eighth MOS transistor "M8" is connected between the one end of the second resistor "R2" and the second node "N2", and the eighth MOS transistor "M8" is connected to the another end of the second resistor "R2" at a gate thereof.

The first switch element "SW1" is connected between the gates and the sources of the first and second DMOS transistors "D1" and "D2".

More specifically, as shown in FIG. 1, for example, the first switch "SW1" is connected to the another end of the second current source "I2" at one end of a current path thereof via the eighth MOS transistor "M8", the second node "N2" and the third resistor "R3", and to the sources of the first and second DMOS transistors "D1" and "D2" at another end of the current path.

As shown in FIG. 1, the first switch element "SW1" is a first switching MOS transistor (nMOS transistor) of the second conductivity type, for example.

The first switching MOS transistor is connected to the gate of the first DMOS transistor "D1" at one end (drain) of a current path thereof, to the sources of the first and second DMOS transistors "D1" and "D2" at another end (source) of the current path, and to the first node "N1" at a gate thereof.

For example, if the first current source "I1" is driven to pass a current, the current flows to the first resistor "R1" to turn on the seventh MOS transistor "M7". As a result, a gate voltage of the first switching MOS transistor becomes higher than a threshold voltage, and the first switching MOS transistor is turned on.

On the other hand, if the first current source "I1." is stopped and passes no current, no current flows to the first resistor "R1", and the seventh MOS transistor "M7" is turned off. Then, if the second current source "I2" is driven to turn on the third MOS transistor "M3", the gate voltage of the first switching MOS transistor becomes lower than the threshold voltage, and the first switching MOS transistor is turned off. The current path that sets the gate voltage of the first switching MOS transistor to be lower than the threshold voltage, which extends from the first node "N1" to the sources of the first and second DMOS transistors "D1" and "D2" via the fifth and third MOS transistors "M5" and "M3", remains until the gate voltage becomes lower than the threshold voltage after the third MOS transistor "M3" is turned on.

In short, the first switch element "SW1" is turned on when the first current source "I1" is turned on to pass a current, and is turned off when the first current source "I1" is stopped and passes no current.

The third resistor "R3" is connected between the second node "N2" and the one end of the first switch element "SW1" (the one end (drain) of the current path of the first switching MOS transistor).

The controlling circuit "CON" controls operations of the first current source "I1" and the second current source "I2".

The controlling circuit "CON" controls the first and second current sources "I1" and "I2" to switch between a first state where the first current source "I1" is driven to pass a first current and the second current source "I2" is stopped and passes no current and a second state where the second current source "I2" is driven to pass a second current and the first current source "I1" is stopped and passes no current.

In the first state described above, the analog switch 100 is in an off state (a state where the first and second DMOS transistors "D1" and "D2" are turned off), as described later.

In the second state described above, the analog switch 100 is in an on state (a state where the first and second DMOS transistors "D1" and "D2" are turned on), as described later.

For example, the controlling circuit "CON" controls the first and second current sources "I1" and "I2" to switch to the first state described above in response to a selection signal (not shown) that turns off the first and second DMOS transistor "D1" and "D2".

The controlling circuit "CON" also controls the first and second current sources "I1" and "I2" to switch to the second state described above in response to a selection signal (not shown) that turns on the first and second DMOS transistor "D1" and "D2".

Next, an example of an operation of the analog switch 100 configured as described above will be described with reference to FIGS. 2 and 3.

Since the gates of the first and second MOS transistors "M1" and "M2" are connected to the sources of the first DMOS transistors "D1" and "D2", the first and second MOS transistors "M1" and "M2" are turned on and off depending on a source potential of the first and second DMOS transistors "D1" and "D2". If the source potential of the first and second DMOS transistors "D1" and "D2" is higher than a voltage that is lower than the second potential ("VSS") by the absolute value of the threshold voltage of the first and second MOS transistors "M1" and "M2" (a normal case), the first and second MOS transistors "M1" and "M2" are turned on and off by the first and second current sources "I1" and "I2", respectively. If the source potential of the first and second DMOS transistors "D1" and "D2" is lower than the voltage that is lower than the second potential ("VSS") by the absolute value of the threshold voltage of the first and second MOS transistors "M1" and "M2" (such as a case of a negative voltage input), both the first and second MOS transistors "M1" and "M2" are turned on.

FIG. 2 is a diagram showing a state of the MOS transistors at the time when the analog switch 100 shown in FIG. 1 is in the off state.

For example, the controlling circuit "CON" controls the first and second current sources "I1" and "I2" to switch to the first state described above in response to the selection signal (not shown) that turns off the first and second DMOS transistors "D1" and "D2".

In this case, the first current source "I1" is driven (i.e., turned on) to pass the first current, and the second current source "I2" is stopped (i.e., turned off) and passes no current.

In this state, the current flows to the first resistor "R1", and the seventh MOS transistor "M7" is turned on. Since no current flows to the second resistor "R2", the eighth MOS transistor "M8" is turned off. In addition, the third and sixth MOS transistors "M3" and "M6" are turned off, and the fourth and fifth MOS transistors "M4" and "M5" are turned on.

That is, no current flows to the third and fifth MOS transistors "M3" and "M5" from the first current source "I1". In addition, no current flows to the fourth and sixth MOS transistors "M4" and "M6" from the second current source "I2".

Thus, the voltage at the first node "N1" is set at a "High" level, and the first switch element "SW1" is turned on. In addition, the voltage at the second node "N2" is set at a "Low" level, and the first and second DMOS transistors "D1" and "D2" are turned off. The turning on of the first switch element "SW1" makes the potentials at the gates and sources of the first and second DMOS transistors "D1" and "D2" equal to each other, so that the first and second DMOS transistors "D1" and "D2" can be turned off with high reliability.

Since the first and second DMOS transistors "D1" and "D2" are turned off, the input signal input to the input terminal "TIN" is interrupted and is not output at the output terminal "TOUT" as the output signal.

Figure 3:
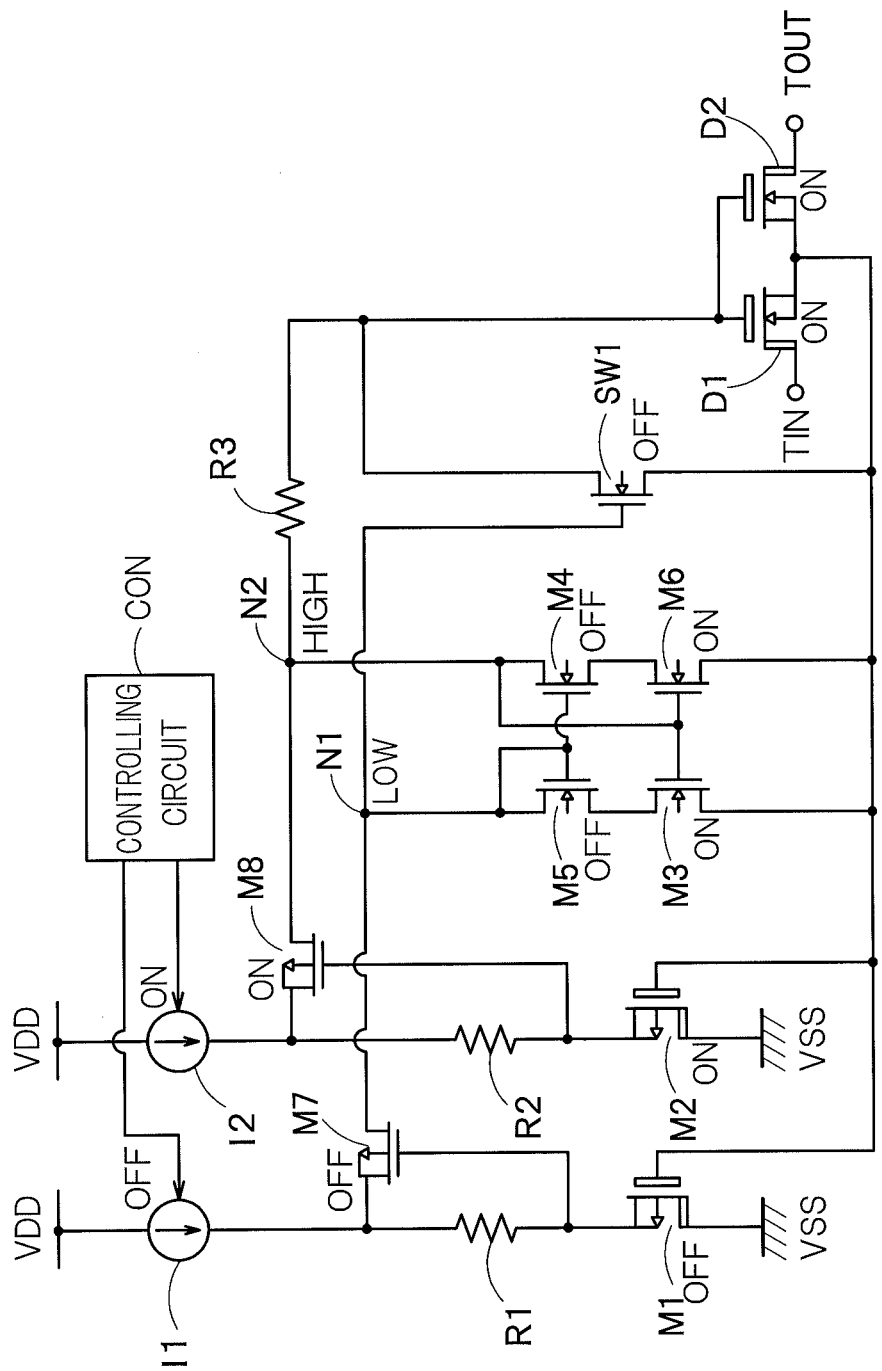
FIG. 3 is a diagram showing a state of the MOS transistors at the time when the analog switch 100 shown in FIG. 1 is in the on state.

FIG. 3 is a diagram showing a state of the MOS transistors at the time when the analog switch 100 shown in FIG. 1 is in the on state.

For example, the controlling circuit "CON" controls the first and second current sources "I1" and "I2" to switch to the second state described above in response to the selection signal (not shown) that turns on the first and second DMOS transistors "D1" and "D2".

In this case, the second current source "I2" is driven (i.e., turned on) to pass the second current, and the first current source "I1" is stopped (i.e., turned off) and passes no current.

In this state, no current flows to the first resistor "R1", so that the seventh MOS transistor "M7" is turned off.

In addition, the current flow to the second resistor "R2", so that the potential at the another end decreases, and the eighth MOS transistor "M8" is turned on.

The third and sixth MOS transistors "M3" and "M6" are turned on, and the fourth and fifth MOS transistors "M4" and "M5" are turned off.

That is, no current flows to the third and fifth MOS transistors "M3" and "M5" from the first current source "I1". In addition, no current flows to the fourth and sixth MOS transistors "M4" and "M6" from the second current source "I2".

Thus, the voltage at the first node "N1" is set at the "Low" level, and the first switch element "SW1" is turned off. In addition, the voltage at the second node "N2" is set at the "High" level, and the first and second DMOS transistors "D1" and "D2" are turned on.

Since the first and second DMOS transistors "D1" and "D2" are turned on, the input signal input to the input terminal "TIN" is output at the output terminal "TOUT" as the output signal.

The current for gate control provides the voltage between the gates and sources of the first and second DMOS transistors "D1" and "D2" but does not flows to the sources of the first and second DMOS transistors "D1" and "D2". Therefore, a cause of occurrence of a voltage difference between the input signal and the output signal is eliminated.

As described above, the analog switch according to the first embodiment can reduce the difference between the voltage of the input signal and the voltage of the output signal.

Second Embodiment

With regard to a second embodiment, there will be described an example of a configuration of an analog switch that has a circuit configuration different from that of the analog switch according to the first embodiment described above in the way of connection between the third to sixth MOS transistors.

FIG. 4 is a circuit diagram showing an example of a configuration of an analog switch 200 according to the second embodiment. In FIG. 4, the same reference symbols as those in FIG. 1 denote the same components as those in the first embodiment, and description of those components will be omitted.

As shown in FIG. 4, as with the analog switch 100 according to the first embodiment, the analog switch 200 includes the first current source (turning-off current source) "I1", the second current source (turning-on current source) "I2", the first resistor "R1", the second resistor "R2", the third resistor "R3", the first MOS transistor "M1" of the first conductivity type, the second MOS transistor "M2" of the first conductivity type, the third MOS transistor "M3" of the second conductivity type, the fourth MOS transistor "M4" of the second conductivity type, the fifth MOS transistor "M5" of the second conductivity type, the sixth MOS transistor "M6" of the second conductivity type, the seventh MOS transistor "M7" of the first conductivity type, the eighth MOS transistor "M8" of the first conductivity type, the first double-diffused MOS (DMOS) transistor "D1" of the second conductivity type, the second DMOS transistor "D2" of the second conductivity type, the first switch element "SW1", and the controlling circuit "CON".

As described above, the third to sixth MOS transistors "M3" to "M6" of the analog switch 200 are connected to each other in a different manner from the third to sixth MOS transistors "M3" to "M6" of the analog switch 100 according to the first embodiment.

In this embodiment, the current path of the fifth MOS transistor "M5" is connected between the another end (source) of the current path of the third MOS transistor "M3" and the sources of the first and second DMOS transistors "D1" and "D2", and the fifth MOS transistor "M5" is connected to the gate of the fourth MOS transistor "M4" at the gate thereof. That is, the fifth MOS transistor "M5" is connected to the another end (source) of the current path of the third MOS transistor "M3" at one end (drain) thereof, to the sources of the first and second DMOS transistors "D1" and "D2" at another end (source) thereof, and to the gate of the fourth MOS transistor "M4" at the gate thereof.

In addition, the current path of the sixth MOS transistor "M6" is connected between the second node "N2" and the one end of the current path of the fourth MOS transistor "M4", and the sixth MOS transistor "M6" is connected to the gate of the third MOS transistor "M3" at the gate thereof. That is, the sixth MOS transistor "M6" is connected to the second node "N2" at one end (drain) thereof, to the one end (Drain) of the current path of the fourth MOS transistor "M4" at another end (drain) thereof, and to the gate of the third MOS transistor "M3" at the gate thereof.

The remainder of the configuration of the analog switch 200 is the same as that of the analog switch 100 shown in FIG. 1.

The remainder of the characteristics of the operation of the analog switch 200 configured as described above is the same as that of the analog switch 100 according to the first embodiment.

That is, as with the analog switch 100 according to the first embodiment, the analog switch 200 according to the second embodiment can reduce the difference between the voltage of the input signal and the voltage of the output signal.

Third Embodiment

With regard to a third embodiment, there will be described an example of a configuration of an analog switch that has a circuit configuration different from that of the analog switch according to the first embodiment described above in that the polarities are reversed.

Figure 5:
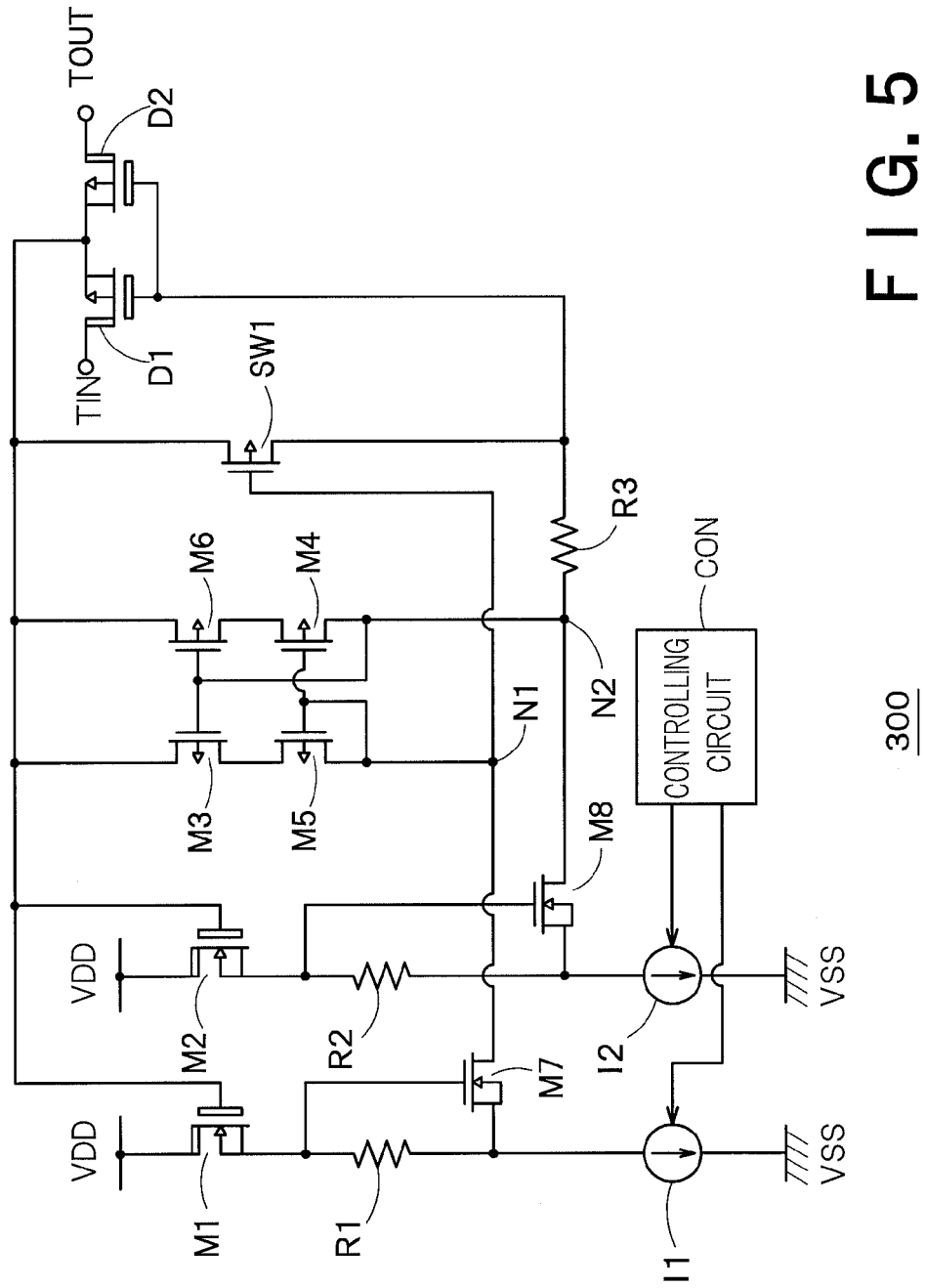
FIG. 5 is a circuit diagram showing an example of a configuration of an analog switch 300 according to the third embodiment.

FIG. 5 is a circuit diagram showing an example of a configuration of an analog switch 300 according to the third embodiment. In the example shown in FIG. 5, the MOS transistor of the first conductivity type is an nMOS transistor, the MOS transistor of the second conductivity type is a pMOS transistor, the first potential is the ground potential "VSS", and the second potential is the power supply potential "VDD". That is, in FIG. 5, the same reference symbols as those in FIG. 1 denote the same components as those in the first embodiment except that the polarities are reversed compared with the components in the first embodiment.

As shown in FIG. 5, as with the analog switch 100 according to the first embodiment, the analog switch 300 includes the first current source (turning-off current source) "I1", the second current source (turning-on current source) "I2", the first resistor "R1", the second resistor "R2", the third resistor "R3", the first MOS transistor "M1" of the first conductivity type, the second MOS transistor "M2" of the first conductivity type, the third MOS transistor "M3" of the second conductivity type, the fourth MOS transistor "M4" of the second conductivity type, the fifth MOS transistor "M5" of the second conductivity type, the sixth MOS transistor "M6" of the second conductivity type, the seventh MOS transistor "M7" of the first conductivity type, the eighth MOS transistor "M8" of the first conductivity type, the first double-diffused MOS (DMOS) transistor "D1" of the second conductivity type, the second DMOS transistor "D2" of the second conductivity type, the first switch element "SW1", and the controlling circuit "CON".

The analog switch 300 has the same circuit configuration as that of the analog switch 100 shown in FIG. 1 except that the polarities are reversed.

The characteristics of the operation of the analog switch 300 configured as described above is the same as the characteristics of the operation of the analog switch 100 according to the first embodiment with the polarities reversed.

That is, as with the analog switch 100 according to the first embodiment, the analog switch 300 according to the third embodiment can reduce the difference between the voltage of the input signal and the voltage of the output signal.

Fourth Embodiment

With regard to a fourth embodiment, there will be described an example of a configuration of an analog switch that has a circuit configuration different from that of the analog switch according to the third embodiment described above in the way of connection between the third to sixth MOS transistors.

FIG. 6 is a circuit diagram showing an example of a configuration of an analog switch 400 according to the fourth embodiment. In FIG. 6, the same reference symbols as those in FIG. 5 denote the same components as those in the third embodiment, and description of those components will be omitted.

As shown in FIG. 6, as with the analog switch 300 according to the third embodiment, the analog switch 400 includes the first current source (turning-off current source) "I1", the second current source (turning-on current source) "I2", the first resistor "R1", the second resistor "R2", the third resistor "R3", the first MOS transistor "M1" of the first conductivity type, the second MOS transistor "M2" of the first conductivity type, the third MOS transistor "M3" of the second conductivity type, the fourth MOS transistor "M4" of the second conductivity type, the fifth MOS transistor "M5" of the second conductivity type, the sixth MOS transistor "M6" of the second conductivity type, the seventh MOS transistor "M7" of the first conductivity type, the eighth MOS transistor "M8" of the first conductivity type, the first double-diffused MOS (DMOS) transistor "D1" of the second conductivity type, the second DMOS transistor "D2" of the second conductivity type, the first switch element "SW1", and the controlling circuit "CON".

As described above, the third to sixth MOS transistors "M3" to "M6" of the analog switch 400 are connected to each other in a different manner from the third to sixth MOS transistors "M3" to "M6" of the analog switch 300 according to the third embodiment.

In this embodiment, the fifth MOS transistor "M5" is connected to the another end (source) of the current path of the third MOS transistor "M3" at one end (drain) thereof, to the sources of the first and second DMOS transistors "D1" and "D2" at another end (source) thereof, and to the gate of the fourth MOS transistor "M4" at the gate thereof.

In addition, the sixth MOS transistor "M6" is connected to the second node "N2" at one end (drain) thereof, to the one end (drain) of the current path of the fourth MOS transistor "M4" at another end (drain) thereof, and to the gate of the third MOS transistor "M3" at the gate thereof.

The remainder of the configuration of the analog switch 400 is the same as that of the analog switch 300 shown in FIG. 5.

The remainder of the characteristics of the operation of the analog switch 400 configured as described above is the same as that of the analog switch 100 according to the first embodiment.

That is, as with the analog switch 100 according to the first embodiment, the analog switch 400 according to the fourth embodiment can reduce the difference between the voltage of the input signal and the voltage of the output signal.

Fifth Embodiment

Figure 7:
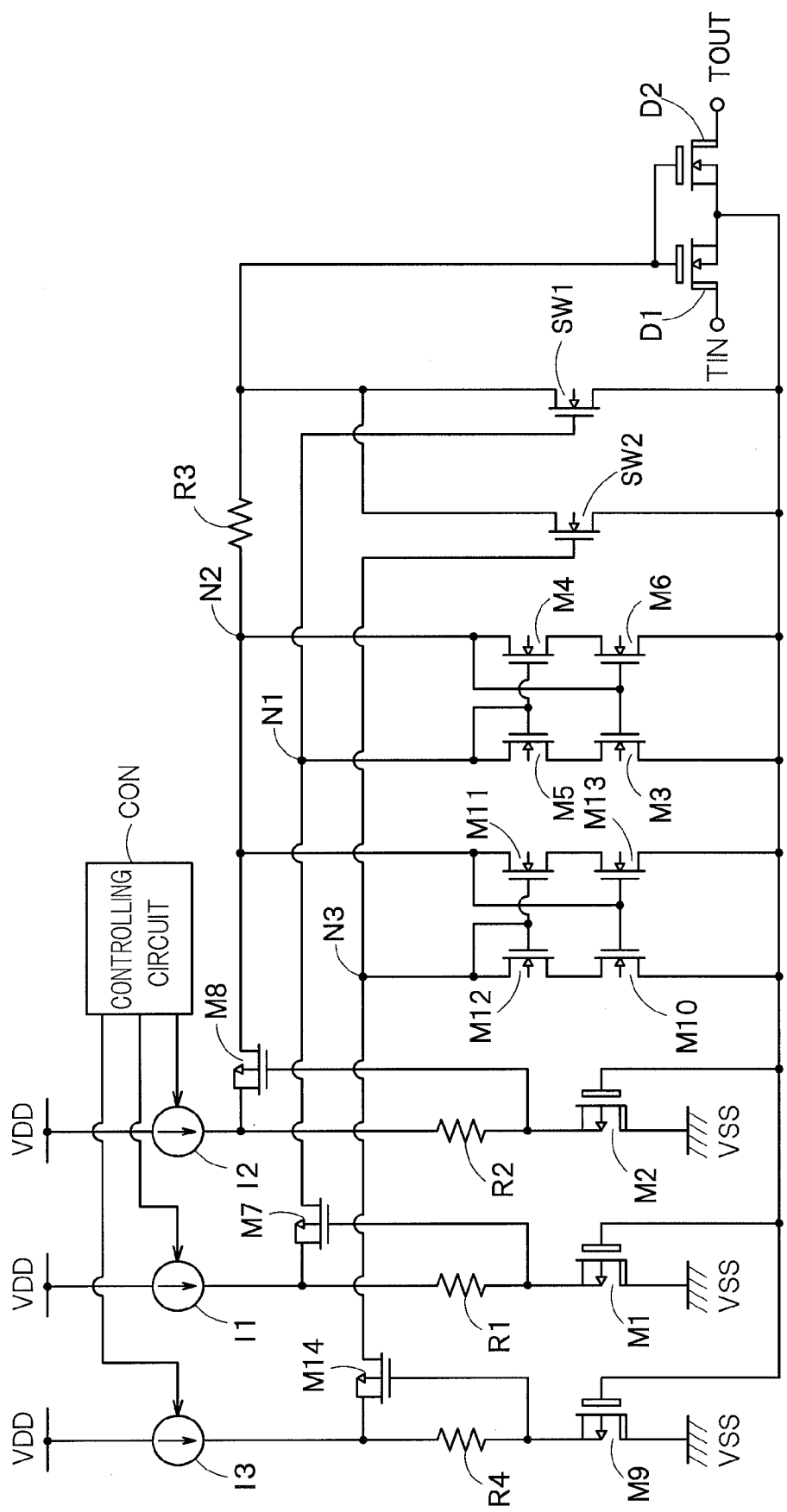
FIG. 7 is a circuit diagram showing an example of a configuration of an analog switch 500 according to a fifth embodiment.

FIG. 7 is a circuit diagram showing an example of a configuration of an analog switch 500 according to a fifth embodiment. In FIG. 7, the same reference symbols as those in FIG. 1 denote the same components as those in the first embodiment, and description of the components will be omitted. In the example shown in FIG. 7, the MOS transistor of the first conductivity type is a pMOS transistor, the MOS transistor of the second conductivity type is an nMOS transistor, the first potential is the power supply potential "VDD", and the second potential is the ground potential "VSS".

As shown in FIG. 7, the analog switch 500 differs from the analog switch 100 according to the first embodiment in that it further includes a third current source (turning-off current source) "I3", a fourth resistor "R4", a ninth MOS transistor of the first conductivity type, a tenth MOS transistor "M10" of the first conductivity type, an eleventh MOS transistor "M11" of the first conductivity type, a twelfth MOS transistor "M12" of the first conductivity type, a thirteenth MOS transistor "M13" of the first conductivity type, a fourteenth MOS transistor "M14" of the first conductivity type, and a second switch element "SW2".

The third current source "I3" is connected to the first potential at one end thereof and is driven to pass a third current.

The fourth resistor "R4" is connected to another end of the third current source "I3" at one end thereof.

The ninth MOS transistor "M9" is connected to another end of the fourth resistor "R4" at one end (source) of a current path thereof, to the second potential at another end (drain) of the current path, and to the sources of the first and second DMOS transistors "D1" and "D2" (the gate of the first MOS transistor "M1") at a gate thereof.

The tenth MOS transistor "M10" is connected to a third node "N3" at one end (drain) of a current path thereof via the twelfth MOS transistor "M12", to the sources of the first and second DMOS transistors "D1" and "D2" at another end (source) of the current path, and to the second node "N2" at a gate thereof.

The eleventh MOS transistor "M11" is connected to the second node "N2" at one end (drain) of a current path thereof, to the sources of the first and second DMOS transistors "D1" and "D2" at another end (source) of the current path via the thirteenth MOS transistor "M13", and to the third node "N3" at a gate thereof.

The twelfth MOS transistor "M12" is connected to the third node "N3" at one end (drain) thereof, to the one end (drain) of the current path of the tenth MOS transistor "M10" at another end (source) thereof, and to the gate of the eleventh MOS transistor "M11" at a gate thereof.

The thirteenth MOS transistor "M13" is connected to the another end (source) of the current path of the eleventh MOS transistor "M11" at one end (drain) thereof, to the sources of the first and second DMOS transistors "D1" and "D2" at another end (source) thereof, and to the gate of the tenth MOS transistor "M10" at a gate thereof.

A current path of the fourteenth MOS transistor "M14" is connected between the one end of the fourth resistor "R4" and the third node "N3", and the fourteenth MOS transistor "M14" is connected to the another end of the fourth resistor "R4" at a gate thereof.

The second switch element "SW2" is connected between the sources of the first and second DMOS transistors "D1" and "D2" and the gate of the first DMOS transistor "D1".

More specifically, as shown in FIG. 7, for example, the second switch element "SW2" is connected to the another end of the second current source "I2" at one end of a current path thereof via the eighth MOS transistor "M8", the second node "N2" and the third resistor "R3", and to the sources of the first and second DMOS transistors "D1" and "D2" at another end of the current path.

As shown in FIG. 7, the second switch element "SW2" is a second switching MOS transistor (nMOS transistor) of the second conductivity type, for example.

The second switching MOS transistor is connected to the gate of the first DMOS transistor "D1" at one end (drain) of the current path thereof, to the sources of the first and second DMOS transistors "D1" and "D2" at another end (source) of the current path, and to the third node "N3" at a gate thereof.

The third node "N3" is connected to the another end of the third current source "I3" via the fourteenth MOS transistor "M14".

For example, if the third current source "I3" is driven to pass a current, the current flows to the fourth resistor "R4" to turn on the fourteenth MOS transistor "M14". As a result, a gate voltage of the second switching MOS transistor becomes higher than a threshold voltage, and the second switching MOS transistor is turned on.

On the other hand, if the third current source "I3" is stopped and passes no current, no current flows to the fourth resistor "R4", and the fourteenth MOS transistor "M14" is turned off. Then, if the second current source "I2" is driven to turn on the tenth MOS transistor "M10", the gate voltage of the second switching MOS transistor becomes lower than the threshold voltage, and the second switching MOS transistor is turned off. The current path that sets the gate voltage of the second switching MOS transistor to be lower than the threshold voltage, which extends from the third node "N3" to the sources of the first and second DMOS transistors "D1" and "D2" via the twelfth and tenth MOS transistors "M12" and "M10", remains until the gate voltage becomes lower than the threshold voltage after the tenth MOS transistor "M10" is turned on.

In short, the second switch element "SW2" is turned on when the third current source "I3" is turned on to pass a current, and is turned off when the third current source "I3" is stopped and passes no current.

The controlling circuit "CON" controls operations of the first to third current sources "I1." to "I3".

The controlling circuit "CON" controls the first, second and third current sources "I1", "I2" and "I3" to switch between a first state where the first and third current sources "I1." and "I3" are driven to pass a first current and the second current source "I2" is stopped and passes no current and a second state where the second current source "I2" is driven to pass a second current and the first and third current sources "I1." and "I3" are stopped and pass no current.

In the first state described above, as in the first embodiment, the analog switch 500 is in an off state (a state where the first and second DMOS transistors "D1" and "D2" are turned off).

In the second state described above, as in the first embodiment, the analog switch 500 is in an on state (a state where the first and second DMOS transistors "D1" and "D2" are turned on).

In the first state described above, the controlling circuit "CON" performs control to drive the third current source "I3" to pass the third current for a prescribed period after the first current source "I1." starts being driven.

As a result, the second switch element "SW2" is kept on for the prescribed period. Since the second switch element "SW2" is kept on for the prescribed period, the gates and the sources of the first and second DMOS transistors "D1" and "D2" are set at an equal potential, so that the first and second DMOS transistors "D1" and "D2" can be turned off with higher reliability.

When the prescribed period has lapsed, the controlling circuit "CON" stops the third current source "I3". Thus, in the first state described above, the second switch element "SW2" is turned off when the prescribed period has lapsed.

For example, if the resistance of the first resistor "R1" is set high, and the first current is set low, the first and second DMOS transistors "D1" and "D2" can be more quickly turned off with higher reliability while reducing the increase of the consumed current, even if the resistance of the fourth resistor "R4" is set low, and the third current is set high.

The remainder of the configuration and operation of the analog switch 500 is the same as that of the analog switch 100 shown in FIG. 1.

That is, as with the analog switch 100 according to the first embodiment, the analog switch 500 according to the fifth embodiment can reduce the difference between the voltage of the input signal and the voltage of the output signal.

Sixth Embodiment

With regard to a sixth embodiment, there will be described an example of a configuration of an analog switch that has a circuit configuration different from that of the analog switch according to the fifth embodiment described above in that the polarities are reversed.

Figure 8:
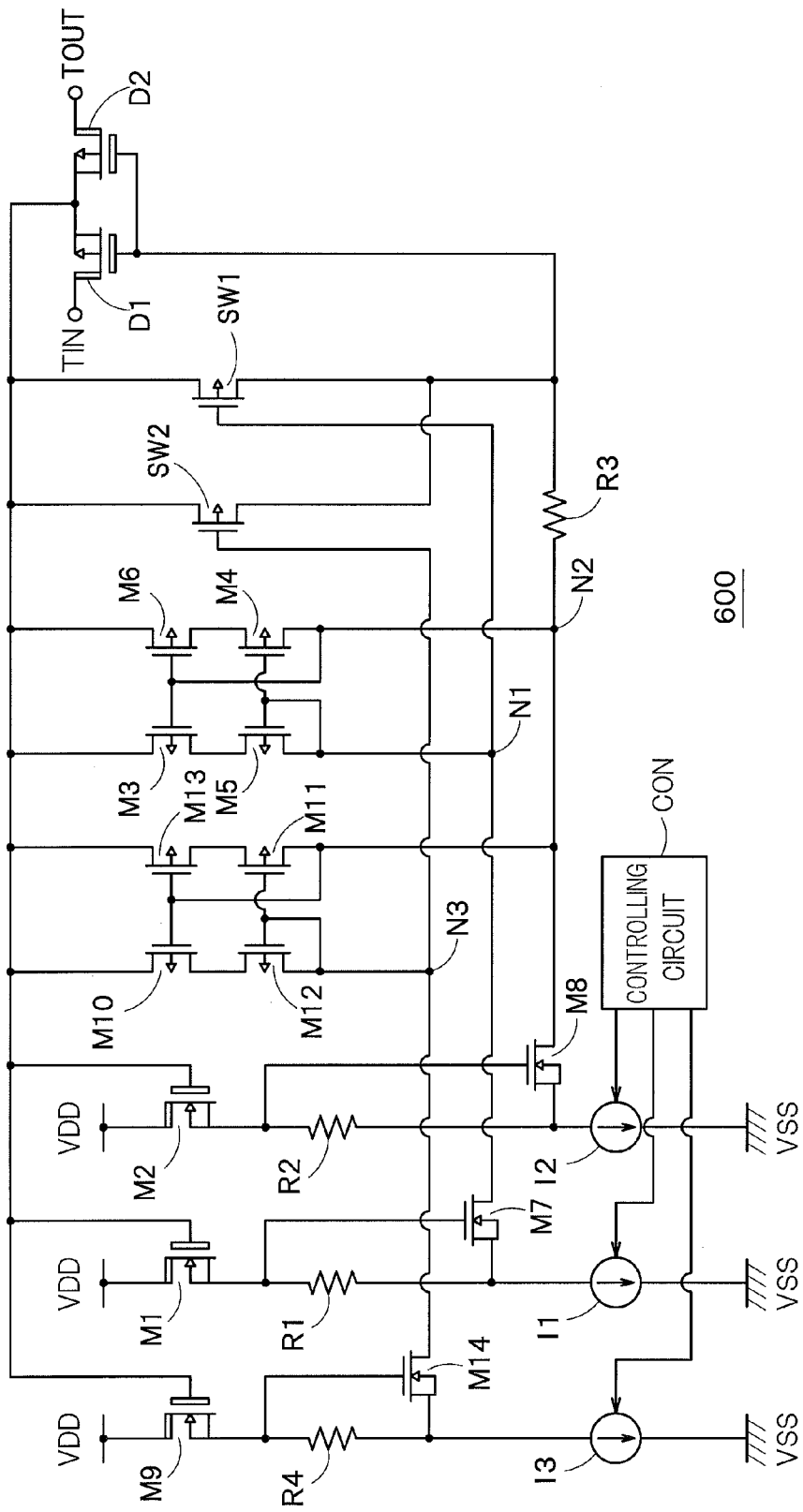
FIG. 8 is a circuit diagram showing an example of a configuration of an analog switch 600 according to the sixth embodiment.

FIG. 8 is a circuit diagram showing an example of a configuration of an analog switch 600 according to the sixth embodiment. In the example shown in FIG. 8, the MOS transistor of the first conductivity type is an nMOS transistor, the MOS transistor of the second conductivity type is a pMOS transistor, the first potential is the ground potential "VSS", and the second potential is the power supply potential "VDD". That is, in FIG. 8, the same reference symbols as those in FIG. 7 denote the same components as those in the fifth embodiment except that the polarities are reversed compared with the components in the fifth embodiment.

As shown in FIG. 8, as with the analog switch 500 according to the fifth embodiment, the analog switch 600 includes the first current source (turning-off current source) "I1", the second current source (turning-on current source) "I2", the third current source (turning-off current source) "I3", the first resistor "R1", the second resistor "R2", the third resistor "R3", the fourth resistor "R4", the first MOS transistor "M1" of the first conductivity type, the second MOS transistor "M2" of the first conductivity type, the third MOS transistor "M3" of the second conductivity type, the fourth MOS transistor "M4" of the second conductivity type, the fifth MOS transistor "M5" of the second conductivity type, the sixth MOS transistor "M6" of the second conductivity type, the seventh MOS transistor "M7" of the first conductivity type, the eighth MOS transistor "M8" of the first conductivity type, the ninth MOS transistor "M9" of the first conductivity type, the tenth MOS transistor "M10" of the second conductivity type, the eleventh MOS transistor "M11" of the second conductivity type, the twelfth MOS transistor "M12" of the second conductivity type, the thirteenth MOS transistor "M13" of the second conductivity type, the fourteenth MOS transistor "M14" of the first conductivity type, the first DMOS transistor "D1" of the second conductivity type, the second DMOS transistor "D2" of the second conductivity type, the first switch element "SW1", the second switch "SW2", and the controlling circuit "CON".

The analog switch 600 has the same circuit configuration as that of the analog switch 500 shown in FIG. 7 except that the polarities are reversed.

The operation of the analog switch 600 configured as described above is the same as the operation of the analog switch 500 according to the fifth embodiment with the polarities reversed.

That is, as with the analog switch 500 according to the fifth embodiment, the analog switch 600 according to the sixth embodiment can reduce the difference between the voltage of the input signal and the voltage of the output signal.

Seventh Embodiment

With regard to a seventh embodiment, there will be described an example of a configuration of an analog switch that has a circuit configuration different from that of the analog switch according to the first embodiment described above in that the fifth and sixth MOS transistors are omitted.

Figure 9:
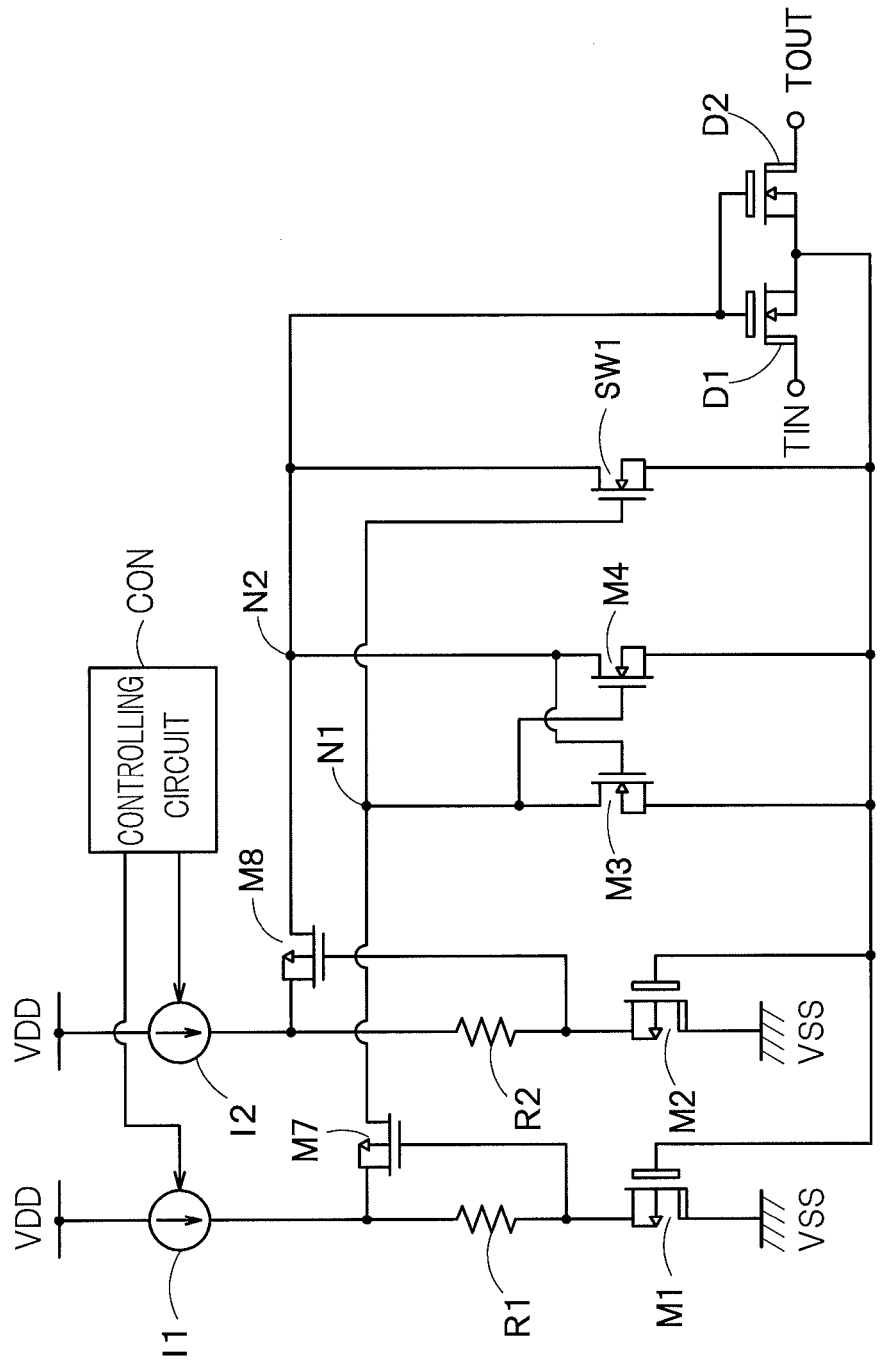
FIG. 9 is a circuit diagram showing an example of a configuration of an analog switch 700 according to the seventh embodiment.

FIG. 9 is a circuit diagram showing an example of a configuration of an analog switch 700 according to the seventh embodiment. In FIG. 9, the same reference symbols as those in FIG. 1 denote the same components as those in the first embodiment, and description of the components will be omitted.

As shown in FIG. 9, the analog switch 700 differs from the analog switch 100 according to the first embodiment in that the fifth and sixth MOS transistors "M5" and "M6" are omitted.

For example, the controlling circuit "CON" controls the first and second current sources "I1" and "I2" to switch to the first state described above in response to a selection signal (not shown) that turns off the first and second DMOS transistor "D1" and "D2".

In this case, the first current source "I1." is driven (i.e., turned on) to pass the first current, and the second current source "I2" is stopped (i.e., turned off) and passes no current.

In this state, the current flows to the first resistor "R1", and the seventh MOS transistor "M7" is turned on. Since no current flows to the second resistor "R2", the eighth MOS transistor "M8" is turned off. In addition, the third MOS transistor "M3" is turned off, and the fourth MOS transistor "M4" is turned on.

Thus, the voltage at the first node "N1" is set at the "High" level, and the first switch element "SW1" is turned on. In addition, the voltage at the second node "N2" is set at the "Low" level, and the first and second DMOS transistors "D1" and "D2" are turned off. The turning on of the first switch element "SW1" makes the potentials at the gates and sources of the first and second DMOS transistors "D1" and "D2" equal to each other, so that the first and second DMOS transistors "D1" and "D2" can be turned off with higher reliability.

Since the first and second DMOS transistors "D1" and "D2" are turned off, the input signal input to the input terminal "TIN" is interrupted and is not output at the output terminal "TOUT" as the output signal.

The controlling circuit "CON" also controls the first and second current sources "I1." and "I2" to switch to the second state described above in response to a selection signal (not shown) that turns on the first and second DMOS transistors "D1" and "D2".

In this case, the second current source "I2" is driven (i.e., turned on) to pass the second current, and the first current source "I1" is stopped (i.e., turned off) and passes no current.

In this state, no current flows to the first resistor "R1", so that the seventh MOS transistor "M7" is turned off. Since the current flow to the second resistor "R2", the eighth MOS transistor "M8" is turned on. In addition, the third MOS transistor "M3" is turned on, and the fourth MOS transistor "M4" is turned off.

Thus, the voltage at the first node "N1" is set at the "Low" level, and the first switch element "SW1" is turned off. In addition, the voltage at the second node "N2" is set at the "High" level, and the first and second DMOS transistors "D1" and "D2" are turned on.

Since the first and second DMOS transistors "D1" and "D2" are turned on, the input signal input to the input terminal "TIN" is output at the output terminal "TOUT" as the output signal.

The remainder of the configuration and operation of the analog switch 700 is the same as that of the analog switch 100 shown in FIG. 1.

That is, as with the analog switch 100 according to the first embodiment, the analog switch 700 according to the seventh embodiment can reduce the difference between the voltage of the input signal and the voltage of the output signal.

Eighth Embodiment

With regard to an eighth embodiment, there will be described an example of a configuration of an analog switch that has a circuit configuration different from that of the analog switch according to the third embodiment described above in that the fifth and sixth MOS transistors are omitted.

Figure 10:
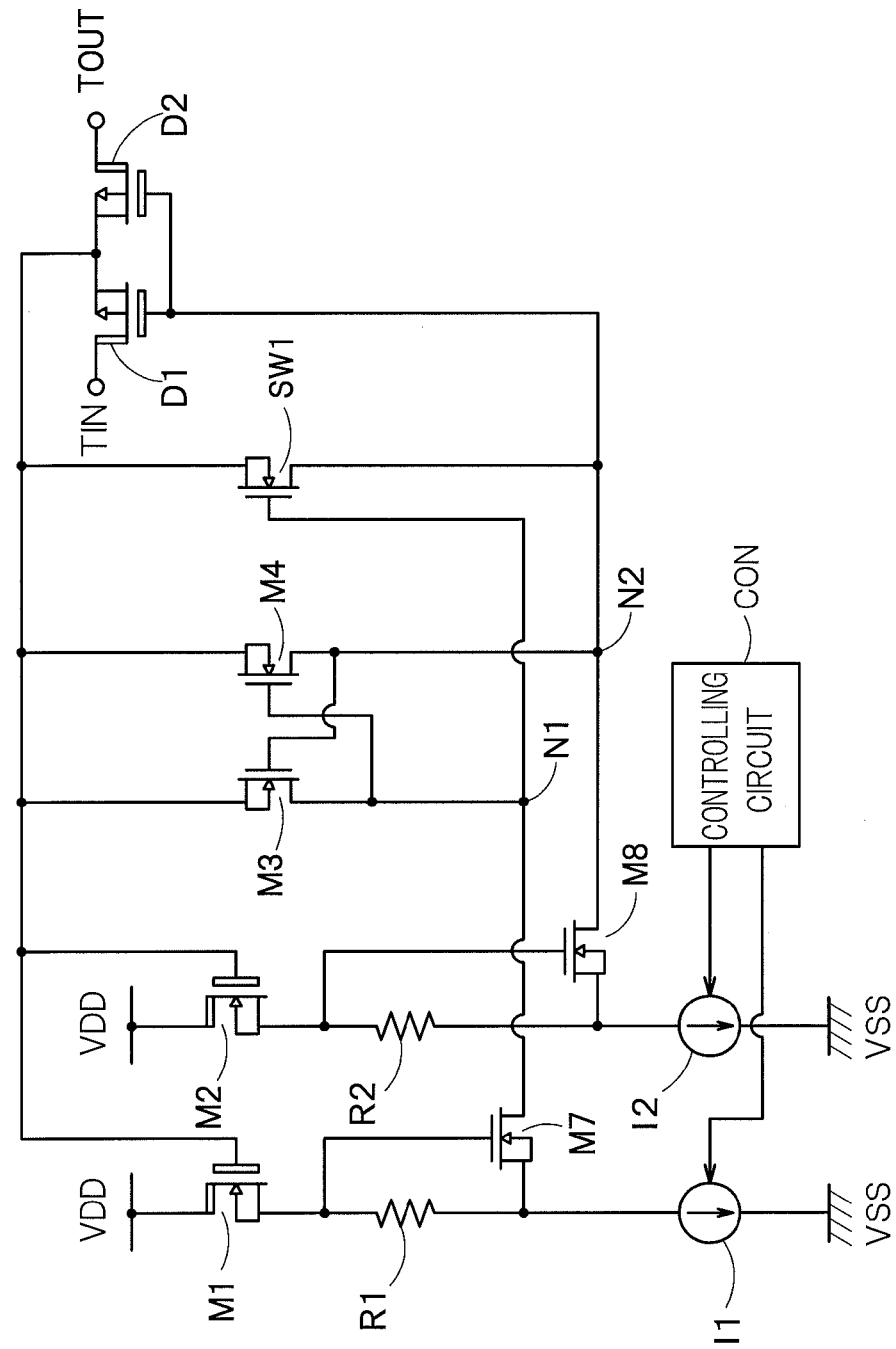
FIG. 10 is a circuit diagram showing an example of a configuration of an analog switch 800 according to the eighth embodiment.

FIG. 10 is a circuit diagram showing an example of a configuration of an analog switch 800 according to the eighth embodiment. In FIG. 10, the same reference symbols as those in FIG. 5 denote the same components as those in the third embodiment, and description of the components will be omitted.

As shown in FIG. 10, the analog switch 800 differs from the analog switch 300 according to the third embodiment in that the fifth and sixth MOS transistors "M5" and "M6" are omitted.

The remainder of the configuration of the analog switch 800 is the same as that of the analog switch 300 shown in FIG. 3.

The operation of the analog switch 800 configured as described above is the same as the operation of the analog switch 700 according to the seventh embodiment with the polarities reversed.

That is, as with the analog switch 700 according to the seventh embodiment, the analog switch 800 according to the eighth embodiment can reduce the difference between the voltage of the input signal and the voltage of the output signal.

Ninth Embodiment

With regard to a ninth embodiment, an example of a configuration of a multiplexer to which any of the analog switches according to the embodiments described above is applied will be described.

Figure 11:
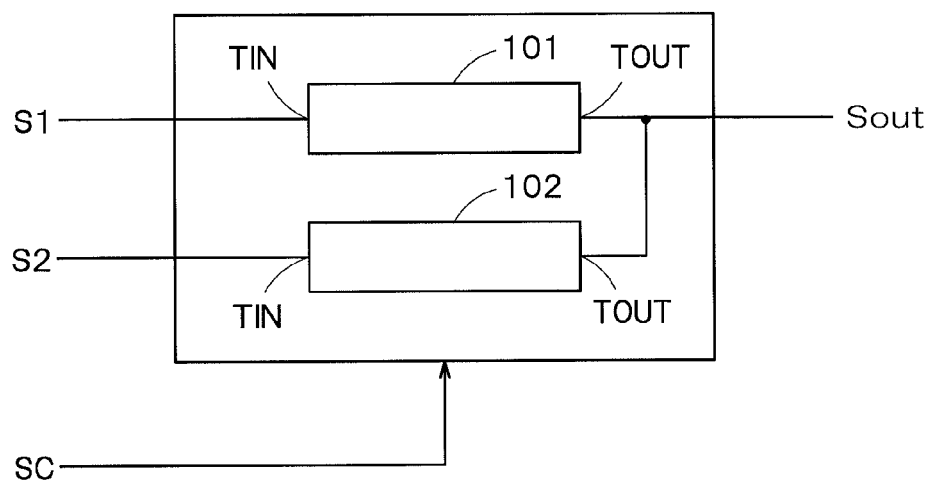
FIG. 11 is a circuit diagram showing an example of a configuration of a multiplexer 1000 according to the ninth embodiment.

FIG. 11 is a circuit diagram showing an example of a configuration of a multiplexer 1000 according to the ninth embodiment. Although the multiplexer is provided with two analog switches in the example shown in FIG. 11, the multiplexer may be provided with three or more analog switches.

As shown in FIG. 11, the multiplexer 1000 selects one of a plurality of input signals "S1" and "S2" in response to a selection signal "SC", and outputs the selected signal as an output signal "Sout".

The multiplexer 1000 is provided with a plurality of (two, in this example) analog switches 101 and 102, the analog switch 101 having an input terminal "TIN" to which the input signal "S1" is input and an output terminal "TOUT" at which the input signal "S1" input to the input terminal "TIN" is output as an output signal, and the analog switch 102 having an input terminal "TIN" to which the input signal "S2" is input and an output terminal "TOUT" at which the input signal "S2" input to the input terminal "TIN" is output as an output signal.

For example, in response to the selection signal "SC", the multiplexer 1000 turns on the analog switch 101 and turns off the analog switch 102. In this case, the input signal "S1" is output as the output signal "Sout".

The analog switch 101 and 102 are any of the analog switches according to the embodiments described above. That is, the analog switches 101 and 102 can reduce the difference between the voltage of the input signal and the voltage of the output signal.

That is, the multiplexer 1000 configured as described above can reduce the difference between the voltages of a plurality of input signals and the voltage of the output signal.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An analog switch comprises:
a first current source that is connected to a first potential at a first end thereof and is driven to pass a first current;
a second current source that is connected to the first potential at a first end thereof and is driven to pass a second current;
a first resistor that is connected to a second end of the first current source at a first end thereof;
a second resistor that is connected to a second end of the second current source at a first end thereof;
a first MOS transistor of a first conductivity type that is connected to a second end of the first resistor at a first end of a current path thereof and to a second potential at a second end of the current path;
a second MOS transistor of the first conductivity type that is connected to a second end of the second resistor at a first end of a current path thereof, to the second potential at a second end of the current path, and to a gate of the first MOS transistor at a gate thereof;
a first DMOS transistor of a second conductivity type that is connected to an input terminal at a first end of a current path thereof and to the gate of the first MOS transistor at a second end of the current path, and is controlled in accordance with the second current;
a second DMOS transistor of the second conductivity type that is connected to the second end of the current path of the first DMOS transistor at a first end of a current path thereof and to an output terminal at a second end of the current path and is controlled in accordance with the second current; and
a first switch element that is connected between a gate and the second end of the current path of the first DMOS transistor and is controlled in accordance with the first current.

2. The analog switch according to claim 1, wherein the first switch element is a first switching MOS transistor of the second conductivity type that is connected to the gate of the first DMOS transistor at a first end of a current path thereof, to the second end of the current path of the first DMOS transistor at a second end of the current path, and to a first node connected to the second end of the first current source at a gate thereof.

3. The analog switch according to claim 2, wherein the analog switch further comprises:
a third MOS transistor of the second conductivity type that is connected to the second end of the first DMOS transistor at a second end of a current path thereof and to a second node connected to the second end of the second current source at a gate thereof;
a fourth MOS transistor of the second conductivity type that is connected to the second node at a first end of a current path thereof and to the first node at a gate thereof;
a fifth MOS transistor of the second conductivity type that is connected to the first node at a first end of a current path thereof, to a first end of the current path of the third MOS transistor at a second end of the current path, and to the gate of the fourth MOS transistor at a gate thereof; and
a sixth MOS transistor of the second conductivity type that is connected to the second end of the current path of the fourth MOS transistor at a first end of a current path thereof, to the second end of the first DMOS transistor at a second end of the current path, and to the gate of the third MOS transistor at a gate thereof.

4. The analog switch according to claim 3, wherein the analog switch further comprises:
a third resistor that is connected between the second node and the first end of the current path of the first switching MOS transistor.

5. The analog switch according to claim 3, wherein the analog switch further comprises:

a seventh MOS transistor of the first conductivity type whose current path is connected between the first end of the first resistor and the first node and that is connected to the second end of the first resistor at a gate thereof; and an eighth MOS transistor of the first conductivity type whose current path is connected between the first end of the second resistor and the second node and that is connected to the second end of the second resistor at a gate thereof.

6. The analog switch according to claim 1, wherein the second end of the second resistor is connected to the second end of the first resistor, and the second MOS transistor is the first MOS transistor.

7. The analog switch according to claim 1, wherein the analog switch further comprises:

a third current source that is connected to the first potential at a first end thereof and is driven to pass a third current;

a fourth resistor that is connected to the second end of the first current source at a first end thereof;

a ninth MOS transistor of the first conductivity type that is connected to a second end of the fourth resistor at a first end of a current path thereof, to the second potential at a second end of the current path, and to the gate of the first MOS transistor at a gate thereof; and a second switch element that is connected between the gate and the second end of the current path of the first DMOS transistor and is controlled in accordance with the third current.

8. The analog switch according to claim 1, wherein a back gate of the first DMOS transistor is connected to a back gate of the second DMOS transistor.

9. The analog switch according to claim 1, wherein the first DMOS transistor and the second DMOS transistor are connected to each other in such a manner that a forward direction of a parasitic diode of the first DMOS transistor and a forward direction of a parasitic diode of the second DMOS transistor are opposite to each other.

10. The analog switch according to claim 1, wherein the first MOS transistor and the second MOS transistor are DMOS transistors.

11. A multiplexer that selects one of a plurality of input signals in response to a selection signal and outputs the selected signal as an output signal, comprising:

a plurality of analog switches that have an input terminal to which an input signal is input and an output terminal at which the input signal input to the input terminal is output as an output signal, wherein the analog switch comprises:

a first current source that is connected to a first potential at a first end thereof and is driven to pass a first current;

a second current source that is connected to the first potential at a first end thereof and is driven to pass a second current;

a first resistor that is connected to a second end of the first current source at a first end thereof;

a second resistor that is connected to a second end of the second current source at a first end thereof;

a first MOS transistor of a first conductivity type that is connected to a second end of the first resistor at a first end of a current path thereof and to a second potential at a second end of the current path;

a second MOS transistor of the first conductivity type that is connected to a second end of the second resistor at a first end of a current path thereof, to the second potential at a second end of the current path, and to a gate of the first MOS transistor at a gate thereof;

a first DMOS transistor of a second conductivity type that is connected to the input terminal at a first end of a current path thereof and to the gate of the first MOS transistor at a second end of the current path, and is controlled in accordance with the second current;

a second DMOS transistor of the second conductivity type that is connected to the second end of the current path of the first DMOS transistor at a first end of a current path thereof and to the output terminal at a second end of the current path and is controlled in accordance with the second current; and a first switch element that is connected between a gate and the second end of the current path of the first DMOS transistor and is controlled in accordance with the first current.

12. The multiplexer according to claim 11, wherein the first switch element is a first switching MOS transistor of the second conductivity type that is connected to the gate of the first DMOS transistor at a first end of a current path thereof, to the second end of the current path of the first DMOS transistor at a second end of the current path, and to a first node connected to the second end of the first current source at a gate thereof.

13. The multiplexer according to claim 12, wherein the analog switch further comprises:

a third MOS transistor of the second conductivity type that is connected to the second end of the first DMOS transistor at a second end of a current path thereof and to a second node connected to the second end of the second current source at a gate thereof;

a fourth MOS transistor of the second conductivity type that is connected to the second node at a first end of a current path thereof and to the first node at a gate thereof;

a fifth MOS transistor of the second conductivity type that is connected to the first node at a first end of a current path thereof, to a first end of the current path of the third MOS transistor at a second end of the current path, and to the gate of the fourth MOS transistor at a gate thereof; and a sixth MOS transistor of the second conductivity type that is connected to the second end of the current path of the fourth MOS transistor at a first end of a current path thereof, to the second end of the first DMOS transistor at a second end of the current path, and to the gate of the third MOS transistor at a gate thereof.

14. The multiplexer according to claim 13, wherein the analog switch further comprises:

a third resistor that is connected between the second node and the first end of the current path of the first switching MOS transistor.

15. The multiplexer according to claim 13, wherein the analog switch further comprises:

a seventh MOS transistor of the first conductivity type whose current path is connected between the first end of the first resistor and the first node and that is connected to the second end of the first resistor at a gate thereof; and an eighth MOS transistor of the first conductivity type whose current path is connected between the first end of the second resistor and the second node and that is connected to the second end of the second resistor at a gate thereof.

16. The multiplexer according to claim 11, wherein the second end of the second resistor is connected to the second end of the first resistor, and
the second MOS transistor is the first MOS transistor.

17. The multiplexer according to claim 11, wherein the analog switch further comprises:
a third current source that is connected to the first potential at a first end thereof and is driven to pass a third current;
a fourth resistor that is connected to the second end of the first current source at a first end thereof;
a ninth MOS transistor of the first conductivity type that is connected to a second end of the fourth resistor at a first end of a current path thereof, to the second potential at a second end of the current path, and to the gate of the first MOS transistor at a gate thereof; and
a second switch element that is connected between the gate and the second end of the current path of the first DMOS transistor and is controlled in accordance with the third current.

18. The multiplexer according to claim 11, wherein a back gate of the first DMOS transistor is connected to a back gate of the second DMOS transistor.

19. The multiplexer according to claim 11, wherein the first DMOS transistor and the second DMOS transistor are connected to each other in such a manner that a forward direction of a parasitic diode of the first DMOS transistor and a forward direction of a parasitic diode of the second DMOS transistor are opposite to each other.

20. The multiplexer according to claim 11, wherein the first MOS transistor and the second MOS transistor are DMOS transistors.

* * * * *